(12) United States Patent
Hirai et al.

(10) Patent No.: US 9,280,814 B2
(45) Date of Patent: Mar. 8, 2016

(54) CHARGED PARTICLE BEAM APPARATUS THAT PERFORMS IMAGE CLASSIFICATION ASSISTANCE

(75) Inventors: Takehiro Hirai, Tokyo (JP); Kenji Obara, Tokyo (JP); Kozo Miyake, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 14/238,561

(22) PCT Filed: Jul. 4, 2012

(86) PCT No.: PCT/JP2012/067036
§ 371 (c)(1),
(2), (4) Date: Feb. 12, 2014

(87) PCT Pub. No.: WO2013/046843
PCT Pub. Date: Apr. 4, 2013

(65) Prior Publication Data
US 2014/0185918 A1 Jul. 3, 2014

(30) Foreign Application Priority Data
Sep. 29, 2011 (JP) .................. 2011-213683

(51) Int. Cl.
*G06K 9/00* (2006.01)
*G06T 7/00* (2006.01)
*H01L 21/66* (2006.01)

(52) U.S. Cl.
CPC .............. *G06T 7/0004* (2013.01); *H01L 22/12* (2013.01); *H01L 22/20* (2013.01); *H01J 2237/2817* (2013.01)

(58) Field of Classification Search
None
See application file for complete search history.

(56) References Cited

U.S. PATENT DOCUMENTS

| | | | |
|---|---|---|---|
| 6,583,413 B1 | 6/2003 | Shinada et al. | |
| 6,850,321 B1* | 2/2005 | Yu | 356/237.4 |
| 7,756,320 B2* | 7/2010 | Honda et al. | 382/149 |
| 8,625,906 B2* | 1/2014 | Isomae et al. | 382/224 |
| 2002/0171051 A1 | 11/2002 | Nakagaki et al. | |
| 2004/0156540 A1* | 8/2004 | Gao et al. | 382/145 |
| 2006/0186351 A1* | 8/2006 | Nishiyama et al. | 250/492.1 |
| 2008/0058977 A1 | 3/2008 | Honda | |
| 2008/0123936 A1 | 5/2008 | Funakoshi | |
| 2008/0204405 A1 | 8/2008 | Koike et al. | |
| 2008/0263028 A1 | 10/2008 | Hirai et al. | |

FOREIGN PATENT DOCUMENTS

JP  2001-074437 A  3/2001
JP  2002-310962 A  10/2002
(Continued)

OTHER PUBLICATIONS

International Search Report, w/ English translation thereof, issued in International Application No. PCT/JP2012/067036 dated Sep. 11, 2012.

*Primary Examiner* — Daniel Mariam
(74) *Attorney, Agent, or Firm* — McDermott Will & Emery LLP

(57) ABSTRACT

The charged particle beam apparatus automatically judges the good or bad of an observation object on the basis of information obtained from an image of the observation object on a wafer; displays a judgment result on a screen; displays the observation object, extracted from the judgment result, that requires to be corrected on the basis of the good or bad of the observation object from a user; and corrects the judgment result to the extracted and displayed observation object on the basis of an instruction from the user.

9 Claims, 13 Drawing Sheets

(56) References Cited

FOREIGN PATENT DOCUMENTS

| JP | 2008-041940 A | 2/2008 |
| JP | 2008-130966 A | 6/2008 |
| JP | 2008-165671 A | 7/2008 |
| JP | 2008-205017 A | 9/2008 |

* cited by examiner

FIG. 7

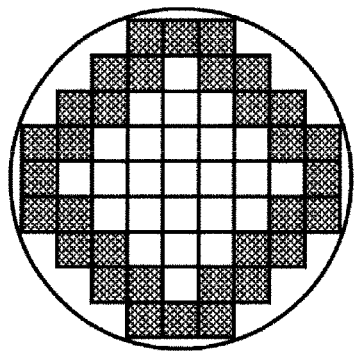

(a) OVERLOOKING PREVENTION SETTING

|  | THE NUMBER OF CHIPS (%) | THE NUMBER OF IMAGES (%) |
|---|---|---|
| ■ WITH DEFECT | 20 (35%) | 2000 (65%) |
| □ WITHOUT DEFECT | 37 (65%) | 1090 (35%) |

LOW    DEFECT DETECTION SENSITIVITY    HIGH

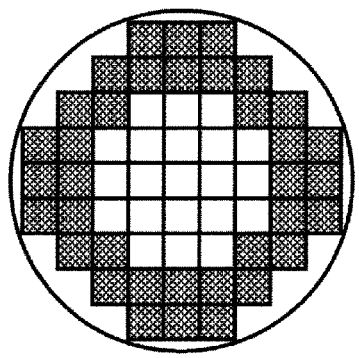

(b) STANDARD SETTING

|  | THE NUMBER OF CHIPS (%) | THE NUMBER OF IMAGES (%) |
|---|---|---|
| ■ WITH DEFECT | 36 (63%) | 2800 (91%) |
| □ WITHOUT DEFECT | 21 (37%) | 290 (9%) |

LOW    DEFECT DETECTION SENSITIVITY    HIGH

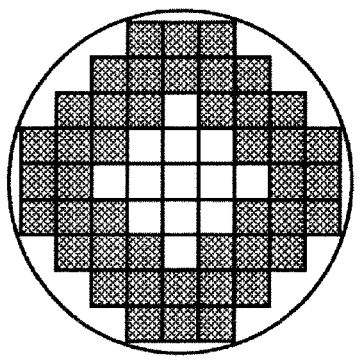

(c) OPTIMAL CONDITION JUDGMENT SETTING

|  | THE NUMBER OF CHIPS (%) | THE NUMBER OF IMAGES (%) |
|---|---|---|
| ■ WITH DEFECT | 44 (77%) | 2960 (96%) |
| □ WITHOUT DEFECT | 13 (23%) | 130 (4%) |

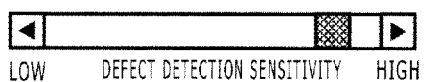

LOW    DEFECT DETECTION SENSITIVITY    HIGH

FIG.10
(a) INITIAL DISPLAY
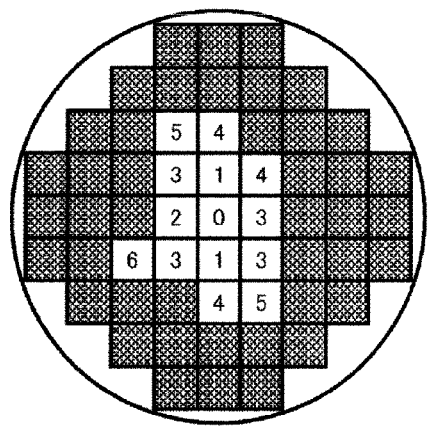
(b) JUDGED EMPHATIC DISPLAY
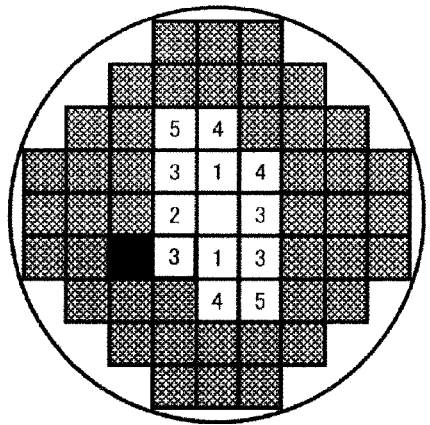
(c) BEFORE NON-DEFECTIVE CHIP AUTOMATIC JUDGMENT
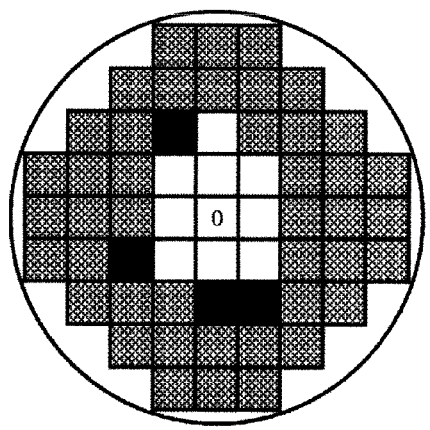
(d) AFTER NON-DEFECTIVE CHIP AUTOMATIC JUDGMENT
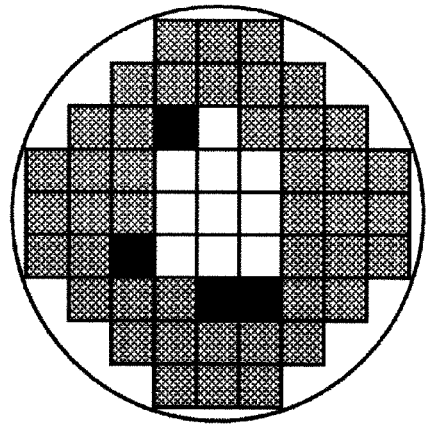

CHARGED PARTICLE BEAM APPARATUS THAT PERFORMS IMAGE CLASSIFICATION ASSISTANCE

RELATED APPLICATIONS

This application is the U.S. National Phase under 35 U.S.C. §371 of International Application No. PCT/JP2012/067036, filed on Jul. 4, 2012, which in turn claims the benefit of Japanese Application No. 2011-213683, filed on Sep. 29, 2011, the disclosures of which Applications are incorporated by reference herein.

TECHNICAL FIELD

The present invention relates to a charged particle beam apparatus for use in process margin evaluation of a semiconductor manufacturing process, an image processing apparatus, and a program executed in those.

BACKGROUND ART

In a manufacturing process for forming a fine pattern on a substrate for a semiconductor and a liquid crystal, for example, a shape of a formed pattern is evaluated as setting conditions of manufacturing equipment or monitoring of a status change in a manufacturing process. In particular, the setting conditions of lithography or the monitoring are evaluated using a pattern which is formed by change of the lithography focus and dose conditions within a wafer surface. Such a wafer for evaluation is called a Focus Exposure Matrix (FEM) wafer.

In the setting conditions using the FEM wafer and the monitoring, a pattern as an object of the evaluation is called a hot spot and is determined by a simulation based on design data. The invention where a pattern on an FEM wafer is evaluated using a critical dimension measurement Scanning Electron Microscope (SEM), disclosing the invention to visually judge which chip is in normal exposure conditions or in exposure conditions with an error in Patent Document 1.

Heretofore, the hot spot has been extracted by the simulation, and a position on the wafer corresponding to the hot spot thus extracted has been actually observed to judge whether the hot spot is defective, thereby evaluating the risk of the hot spot.

PRIOR ART LITERATURE

Patent Document

Patent Document 1: JP-2008-205017-A

Problem to be Solved by the Invention

In recent years, the number of cases where the extraction of the hot spot by the simulation is insufficient due to the miniaturization of the pattern as an observation object and the complexity of the manufacturing process following the miniaturization has been on the increase. Specifically, there are a case where the point to be evaluated is not extracted by the simulation and a case where too many hot spot candidates make it difficult to evaluate in full-point, which, the case, would limit to only evaluating the higher hot spot candidates from the result of the simulation. There are, however, increasing cases where the hot spot to be evaluated are omitted from the object of the evaluation. Increasing the number of hot spot candidates will be effective in preventing the omission of the evaluation; however, the judgment as to whether the hot spot candidate is actually defect will be entrusted to manual evaluation, limiting the number of points that can be evaluated with the manual evaluation as a bottleneck.

A computer that conducts defect judgment and classification of a pattern defect inspection apparatus and a pattern defect review apparatus has lower accuracy than manual work. The evaluation of the hot spot candidates requires high accuracy in the defect judgment and classification, which makes it difficult to leave this evaluation to full automation by these apparatuses.

The purpose of the present invention is to efficiently evaluate an object to be evaluated by improving accuracy in evaluation while lightening the burden of evaluation of an observed image.

Means for Solving the Problems

In order to solve the problems described above, a charged particle beam apparatus of the present invention; judges the good or bad of an observation object on the basis of information obtained from an image of the observation object on a wafer; displays a judgment result on a screen; displays the observation object, extracted from the judgment result, that requires to be corrected on the basis of the good or bad of the observation object from a user; and corrects the judgment result to the extracted and displayed observation object on the basis of an instruction from the user.

Advantageous Effect of the Invention

According to the present invention, since the burden on the manual visual confirmation can be reduced, the efficiency of the evaluation for the image of the observation object can be improved.

BRIEF DESCRIPTION OF THE DRAWINGS

FIG. 7 is a conceptual diagram and a screen structural view of ADC parameter setting.
FIG. 10 is a display example of a wafer map in the processing of the MDC assistance.

MODE FOR CARRYING OUT THE INVENTION

Hereinafter, an embodiment of the present invention will be described with reference to the drawings.

Although a SEM type observation instrument is exemplified as one aspect of a charged particle beam apparatus in the embodiment described below, the present invention is not limited thereto. The present invention can also be applied to a SEM type pattern critical dimension measurement instrument (CD-SEM), for example.

The SEM type observation instrument is an instrument that receives as input information the defect coordinates detected in a higher pattern defect inspection system such as an optical or SEM type inspection instrument and acquires a high-definition SEM image in the coordinates concerned. In addition, the hot spot coordinates extracted by simulation based on design data can also be used as the input information. Moreover, these instruments have a function to classify and evaluate the image acquired by Automatic Defect Classification (ADC) or Manual Defect Classification (MDC). The ADC or MDC can also be carried out in an image processing apparatus connected to the SEM type observation instrument through a network.

The ADC is processing for automatically classifying the attribute of the defect in a classification processing unit of the charged particle beam apparatus described later using the information such as a feature value of the defect obtained from the image acquired. The MDC is processing for classifying the attribute of the defect in accordance with a result of a user's judgment input through an interface. The classification evaluation by the ADC or MDC is a processing that classifies or evaluates the image acquired on the basis of whether the defect candidate is a true defect, or what kind of defect the defect candidate is, for example before judging whether an observation object (such as a chip) containing position coordinates in which the image concerned is acquired is a nondefective product.

As compared with the MDC based on the manual visual confirmation, the classification performance of the ADC is not necessary enough in some cases. In this embodiment, to compensate for deficiency in performance of the ADC, the MDC is used together with the ADC, and the ADC is utilized as the pre-processing of the MDC, thereby improving the reliability of the classification result.

Figure 1:
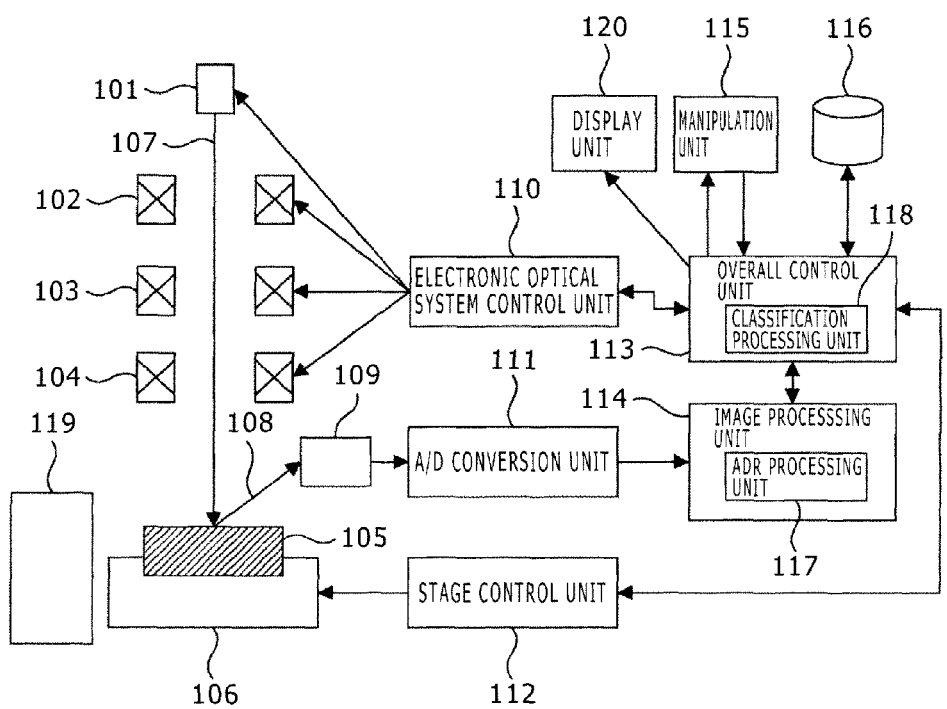
FIG. 1 is a configuration diagram of a SEM type observation instrument.

FIG. 1 is a schematic diagram showing an overall configuration of a SEM type observation instrument of this embodiment. The SEM type observation instrument of FIG. 1 includes an electronic optical system including optical elements such as an electron gun 101, a lens 102, a deflector 103, an objective lens 104, a specimen 105, and a secondary article detector 109. The SEM type observation instrument of FIG. 1 also includes a stage 106, an electronic optical system control unit 110, an A/D conversion unit 111, a stage control unit 112, an overall control unit 113, an image processing unit 114, a manipulation unit such as a keyboard and mouse, an optical microscope 119, and a display unit 120 such as a display device. The stage 106 moves a specimen stage for holding the specimen to be an observation object to the inside of an XY plane. The electronic optical system control unit 110 controls the various optical elements included in the electronic optical system concerned. The A/D conversion unit 111 quantizes an output signal from the secondary particle detector 109. The stage control unit 112 controls the stage 106. In addition, the electronic optical system, the electronic optical system control unit 110, the A/D conversion unit 111, the stage 106, and the stage control unit 112 are a part of a scanning electron microscope as imaging means of a SEM image.

After a primary electron beam 107 emitted from the electron gun 101 is focused by the lens 102. After being deflected by the deflector 103, the primary electron beam 107 is focused by the objective lens 104 to be radiated to the specimen 105. A secondary particle 108 such as a secondary electron and a reflected electron is generated on the basis of a shape or material of the specimen from the specimen 105 to which the primary electron beam 107 has been radiated. After the secondary particle 108 is detected by the secondary particle detector 109, the secondary particle 108 is converted into a digital signal by the A/D conversion unit 111. An output signal from the secondary particle detector converted into the digital signal is referred to as an image signal in some cases. An output signal from the A/D conversion unit 111 is input to the image processing unit 114 to form the SEM image. The image processing unit 114 includes an Automatic Defect Review (ADR) processing unit 117 for executing image processing such as defect detection by using the SEM image thus generated, and in addition thereto, executes various pieces of image processing.

The control for the optical elements such as the lens 102, the deflector 103, and the objective lens 104 in the inside of the electron optical system is carried out in the electronic optical system control unit 110. The control for the position of the specimen is carried out by the stage 106 which is controlled by the stage control unit 112. The overall control unit 113 is a control unit for generally controlling the entire SEM type observation instrument. Thus, the overall control unit 113 interprets an input from the manipulation unit 115, a storage device 116, controls the electronic optical system control unit 110, the stage control unit 112, and the image processing unit 114, for example, and outputs the processing result to the display unit 120 and the stage device 116 as necessary. In addition, the processing of automatically classifying the defect is executed by the overall control unit 113 that includes a classification processing unit 118 for carrying out the ADC. The classification processing unit 118 carries out the ADC by using either the SEM image extracted by the ADR processing unit or the image stored in the storage device 116.

The ADR processing unit 117 or classification processing unit 118 described above can be realized by either method of hardware or software. With hardware to configure the ADR processing unit 117 or the classification processing unit 118, a plurality of computing units executing processing necessary for the ADR or ADC should be integrated on a wiring substrate or within one semiconductor chip or a package, thereby making it possible to realize the configuration. With software to configure the ADR processing unit 117 or the classification processing unit 118, a high-speed general-purpose CPU should be installed on the ADR processing unit 117 or the classification processing unit 118 for executing a program that executes the processing of the ADR or ADC, thereby making it possible to realize the configuration.

It is noted that the processing in this embodiment shown below can also be realized by a program. The existing SEM type observation instrument can be upgraded by installing the program of the present invention.

Figure 2:
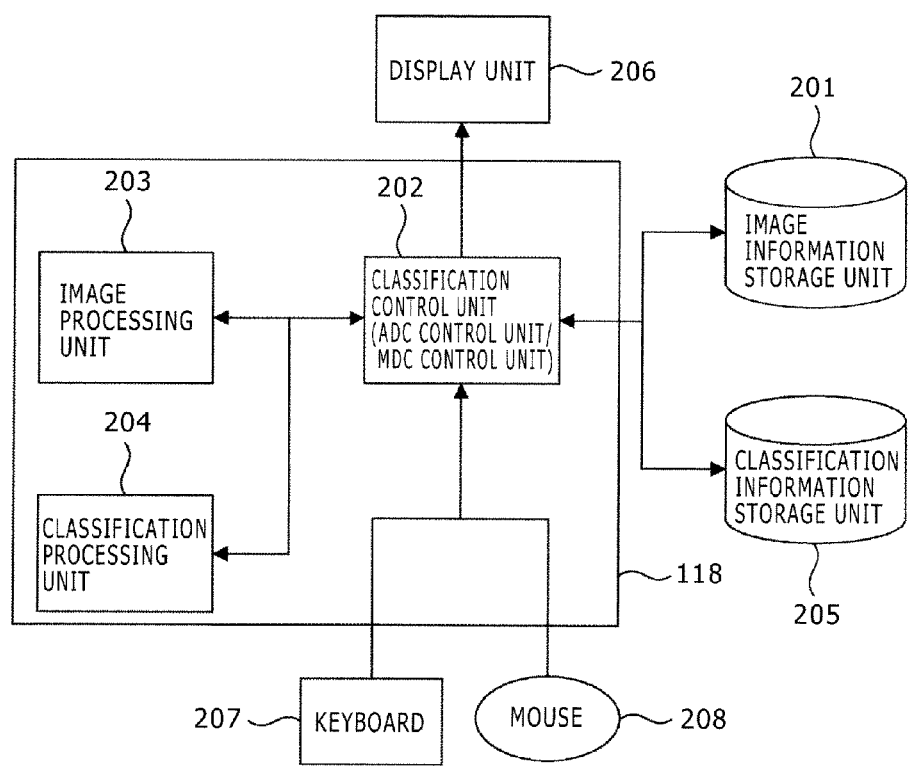
FIG. 2 is a configuration diagram of a classification processing unit.

FIG. 2 shows a detailed diagram of the classification processing unit 118 of FIG. 1. The classification processing unit 118 shown in FIG. 2 is composed of a plurality of functional blocks realized by executing a predetermined program by a CPU provided in the overall control unit 113 of FIG. 1. The classification processing unit 118 of FIG. 1 is configured by including a classification control unit 202, an image processing unit 203, and a classification processing unit 204. The classification control unit 202 controls the whole ADC processing. The image processing unit 203 executes pre-processing necessary for the defect classification. The classification processing unit 204 executes actual defect classification processing by using the image data that has been preprocessed in the image processing unit 203. The above functional blocks can also be realized by hardware. In that case, a semiconductor device where computing units realizing the classification control unit 202, the image processing unit 203, and the classification processing unit 204 are integrated is provided inside the overall control unit 113.

An image information storage unit 201 storing the image data that has been preprocessed in the image processing unit 203 and a classification information storage unit 205 storing the classification result that has been carried out in the classification processing unit 204 are connected to the classification processing unit 118. The result information is also stored as verification data for verifying the result of the ADC in the classification information storage unit 205. These storage units correspond to a partition, a logic volume, or a file system, for example, provided inside the storage device 116. In addition, a manipulation unit 115 including a keyboard 207 or a mouse 208, and a display unit 206 displaying a Graphical User Interface (GUI) for giving an instruction to the processing result of the ADC or to the device (or a unit) are connected to the classification processing unit 118.

Image information on an observation image acquired in the scanning electron microscope as the image capturing means is preserved in the image information storage unit 201. The image information here, for example, includes not only the observation image acquired from the image capturing means, but also information on the observation conditions such as optical conditions and an image capturing mode in a phase of the image capturing, an observation point such as the observation position coordinates, supplementary information such as information on an observation chip and a shot, and an image into which the observation image is processed in the image processing unit in addition. Firstly, the classification control unit 202 reads out the image information from the image information storage unit 201 and transfers the image information to the image processing unit 203. The image processing unit 203 obtains the corresponding data such as the various feature value of the observation image necessary for the classification processing, for example a size, a shape, a luminance distribution, a texture etc of a defect unit, a size, a shape, a luminance distribution, a texture, etc of a background pattern, and a positional relationship between the defect unit, the background pattern, and the like from the image information thus transferred thereto. The image processing unit 203 then preserves the corresponding data in the image information storage unit 201.

Next, the classification control unit 202 reads out the feature value data of the observation image preserved in the image information storage unit 201 and transfers the feature value data to the classification processing unit 204. The classification processing unit 204 executes the processing of classifying the defect on the basis of predetermined classification models and then preserves the processing result in the classification information storage unit 205.

The classification models have a teaching type and a rule-based type. The teaching type is such that a classifier is automatically configured by the teaching of the feature value data correspond to correct classification results. For example, a feature value space is divided to be made to correspond to categories by defining a boundary in the feature value space based on the teaching data. Then, the classification object can be classified into a category by determining which of the feature value spaces a classification object belongs to. A technique for defining the boundary of the feature value space includes two methods: a method of classifying the boundary into a category of the taught defect with the closest distance in the feature value space thereto. The other method classifies the boundary into a category with the highest occurrence probability of the feature value to be classified after estimation of the feature value distribution of each defect category based on the teaching data. These two methods are basic types in the teaching type classification.

The rule-based type, on the other hand, is a method of carrying out the classification in accordance with a rule described with "if-then-else," for example. A typical model is a classification model of a binary partition tree structure that repeats to divide a set of defects as the classification object into two parts to eventually classify the set of defects into categories. The rule-based type has been in practical use as an expert system or Business Rules Management System (BRMS).

When a rule-based type algorithm is applied to the ADC in a semiconductor or liquid crystal inspection/observation instrument, irregularities of the defect unit, the positional relationship, for example, between the defect unit and the background pattern are defined as a basic rule in many cases. In addition thereto, a hybrid type, for example, combining the teaching type and the rule-based type has been in practical use.

A program for carrying out the defect classification based on the classification models is stored in the storage device 116. The CPU within the overall control unit 113 executes this program, thereby realizing a classification processing function of the classification processing unit 204. An instruction to execute the various pieces of processing and selection of the data on the processing object, for example, can be instructed from the manipulation unit 115 including the keyboard 207 or the mouse 208. The execution process such as the above instruction contents, classification processing, and preservation is displayed on the display unit 206. Thus, the user of the apparatus can confirm the processing contents of the ADC by confirming the displayed contents. It is noted that the classification processing unit 118 is not necessarily provided inside the overall control unit 113, but the classification processing unit 118 may be realized by information processing means, provided independently of the overall control unit 113, such as a computer connected to the SEM type observation instrument through a network. The same ADC processing can also be parallelized by a plurality of pieces of information processing means connected to the overall control unit 113.

Although a MDC work can also be carried out in the classification processing unit, a configuration different from the classification processing unit, for example, a personal computer which is accessible to the image information storage unit 201 or the classification information storage unit 205 may be connected to the network. Since the SEM type observation instrument is installed inside a clean room, the MDC processing requiring the manipulation by the user is executed remotely, whereby the processing can be executed from the outside of the clean room as well. A case where the classification processing unit of FIG. 2 is used in the MDC work will now be described as an example here. The information read from the image information storage unit 201 and the classification information storage unit 205 is converted into a proper display form for the purpose of improving the MDC work efficiency and is then displayed on the display unit 206. Although the details of the concrete conversion method and display method will be described later, the wafer map, the observed image, the ADC result, the MDC result, and the like are displayed. An operator can input information for correction or determination of the ADC result based on the MDC result by using the keyboard 207 or the mouse 208 as the input device.

Figure 3:
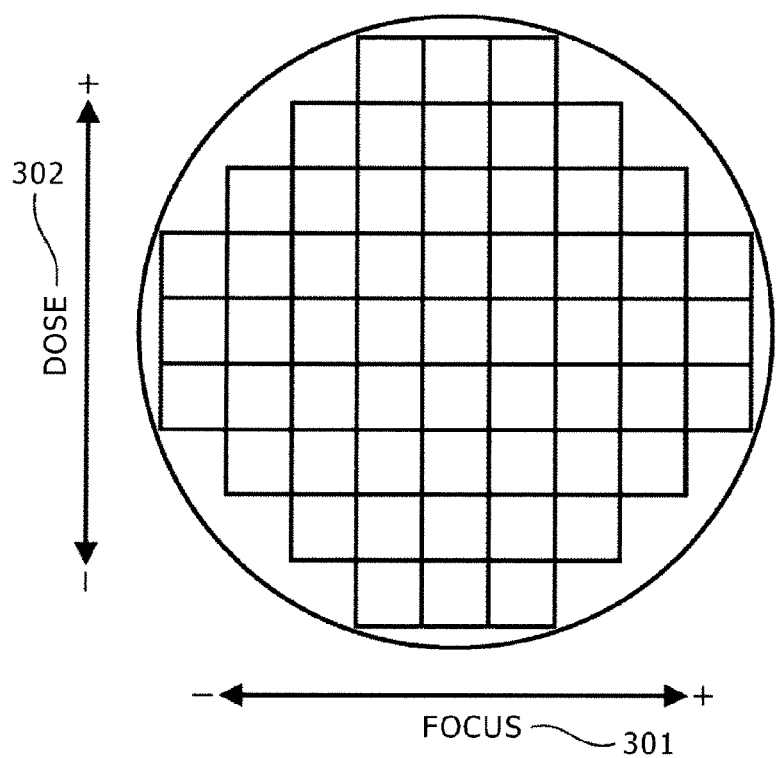
FIG. 3 is an example of a FEM wafer.

FIG. 3 is an example of the FEM wafer used in the evaluation. The FEM wafer is used in the setting conditions of the lithography by the hot spot evaluation and the process monitoring. As shown in the figure, evaluation patterns manufactured by changing a focus position condition 301 and a dose amount condition 302 are analyzed, thereby carrying out the setting of the conditions of the lithography and the monitoring. Normally, the FEM wafer is manufactured in such a way that the focus position condition 301 and the dose amount condition 302 are monotonously changed within the wafer surface. This embodiment is especially effective in the specimen in which defective chips are distributed with a predetermined tendency within the specimen surface such as the FEM wafer. Although hereinafter, the case where such an FEM wafer is obtained will be described as an example, the present invention is by no means limited to the FEM wafer. For example, in the case where even in the normal wafer, many defects are present in specific units of the wafer such as the wafer outer peripheral unit, and thus many defective chips are present therein, the classification and evaluation method of this embodiment is effective. In addition, when the FEM wafer is used, arrangement information on the shots or the chips is preserved as input information in the image information storage unit 201 or the classification storage unit 205 of FIG. 2, for example. When such information is not input, it is only necessary to execute grouping processing on the basis of the coordinates information on the observation object, for example. The grouping processing shows that the wafer is divided are by area suitable for the evaluation, that is, every observation object for which the good or bad judgment is made in increments corresponding to the chip or shot arrangement. Even in the case where the chip or shot information is directly absent, when the information is input as the chip or the shot pitch in the form of the additional information in the phase of the image capturing, those pieces of information can be used. When not only the chip information but also the shot information is present, the more detailed analysis and monitoring of a tilt of a mask in the phase of the exposure, for example, are possible. When there is no information corresponding to the chip or shot arrangement, the user may be made to input the size with which the area is divided or the number of pieces of division, or the number of pieces of suitable division may be estimated to be presented from the past evaluation results or a distribution of the observation points in the evaluation object. Such grouping processing can be executed in the classification control unit 202, for example, including the ADC control unit.

Note that, hereinafter, a description will be given with respect to an example in which the images of the coordinates of the hot spots or the defect candidate detection positions are acquired, the images acquired through the ADC processing and the MDC processing are classified, and the good or bad judgment to the chips containing therein the coordinates concerned is made on the basis of classification result. However, the grouping processing described above is executed, whereby instead of making the good or bad judgment in the increments of chips, the good or bad judgment may be carried out every shot as an exposure unit in the exposure process, or the unit of the good or bad judgment may be previously specified by the user.

Figure 4:
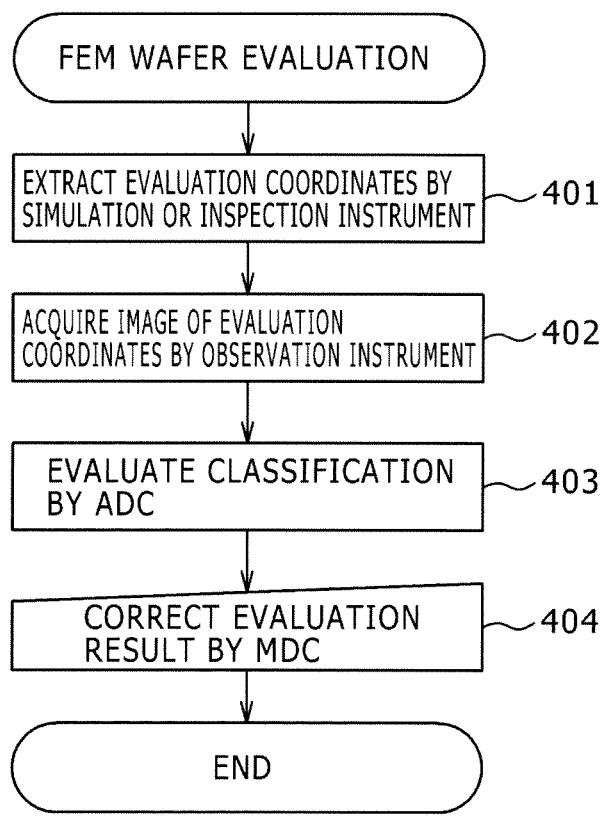
FIG. 4 is a flow chart of evaluation of the FEM wafer.

FIG. 4 is a flow chart showing a procedure of the FEM sample evaluation. Firstly, the extraction of the hot spot by the simulation or defect detection carried out by high sensitivity inspection made by an inspection instruction is carried out, thereby determining the coordinates for acquiring an image (Step 401). Next, a high-definition image of the coordinates for acquiring an image is acquired by the observation instrument (Step 402). At this time, although the image can be manually acquired, the automatic acquisition by the ADR is preferable as a large amount of images are acquired. The observation images which have been acquired using the ADC are classified, and the good or bad of the chips containing therein the coordinates with which the image has been acquired is evaluated (Step 403). The classification by the ADC is not necessarily correct. Therefore, at the end, the user is urged to evaluate using the MDC on the basis of the ADC result, and the judgment result by the ADC is corrected in accordance with the classification or evaluation result by the user (Step 404). Since it is understood from the above processing that under what type of the conditions the chip is exposed is the non-defective product, it is possible to extract the optimal exposure condition or the determine a process window. It is noted that the process window is an allowable width of the processing conditions, and thus the non-defective chip can be manufactured by setting the exposure conditions within the process window. The ADC and MDC works are controlled by the classification control unit 202 by using the information preserved in the image information storage unit 201 or the classification information storage unit 205. In particular, in the case of the MDC work, it is accompanied by an input work by the operator. Specifically, on the basis of the good or bad judgment result by the ADC displayed on the display unit 206, the classification result is determined for the observation object extracted from that good or bad judgment result by using the input with the keyboard 207 or the mouse 208.

Figure 5:
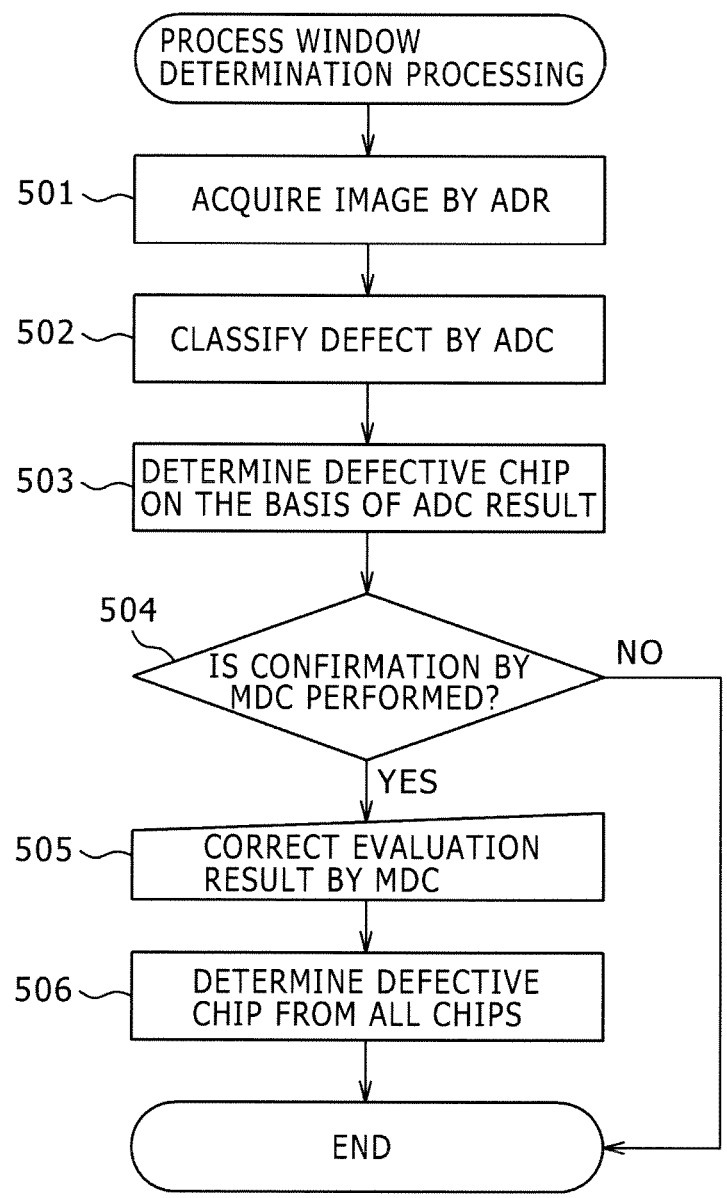
FIG. 5 is a flow chart of determination processing of a process window.

FIG. 5 is a flow chart showing a detailed procedure of process window determination processing utilizing the ADR/ADC. Firstly, the observation image of the hot spot or the defect candidate position input from a higher inspection instrument is automatically acquired by the ADR (Step 501). By using the ADC, the observation image thus acquired is classified, and the chip containing therein the position where the observation image has been acquired is evaluated (Step 502). Next, the defective chip is determined on the basis of ADC result (Step 503). Specifically, a chip with defects exceeding the number of defects allowed in the chip, set as a threshold in advance, is judged as a defective chip, whereas a chip with no defects going over the threshold is determined as a non-defective chip. In general, a chip with even one defect is often called a defective chip; however, a system with threshold setting changeable according to the classification accuracy of the ADC or the evaluation purpose is preferable. Introduction of a plurality of thresholds will enable the system to cope with the classification of three or more levels such as non-defective/indeterminable/defective instead of the two levels of non-defective/defective.

Although the defective chip is determined by the ADC processing in the example shown above, the non-defective chip may be determined by the ADC processing as well on the contrary. In this case, the defective chip will be re-judged by the MDC processing to be described later.

In case of the operation of determining the process window by trusting the classification result by the ADC, the processing ends in this step (Step 503). However, since the classification accuracy rate of the ADC is not necessarily 100% depending on the degree of difficulty of the classification definition, the confirmation work by the MDC is necessary in some cases (Step 504). According to this embodiment, since the MDC work can be minimized, it is possible to propose an operation premising the confirmation by the MDC. It is only necessary that the confirmation by the MDC should be limited to a chip other than a chip judged as defective by the ADC processing. That is to say, the chip judged as non-defective in the ADC processing is extracted as a subject for the MDC processing. In Step 505, an image acquired in the coordinate position contained in the extracted chip as the subject for the MDC processing is displayed, and then, the defect candidates of the image concerned are classified by the user. The MDC processing unit corrects the ADC judgment result to the image concerned in accordance with the result of the user's classification. As the result, the evaluation of the chip is corrected.

Where the chip judged as non-defective by the ADC is premised on manual reconfirmation, it is better that the classification parameters should be adjusted in such a way as to, although some defect overlooking is allowed, prevent so-called overrun detection that misjudges the non-defective as defective. On the contrary, where the chip judged as defective by the ADC is premised on manual reconfirmation, it is better that the classification parameters should be adjusted in such a way as to, although some overrun detection of defect is allowed, prevent the defect overlooking. That is to say, it is important that the parameters of the ADC are judged in such a way as not to allow any misjudgment on the observation object intended to trust the ADC processing result even though misjudgment by the ADC is allowed on the observation object intended to be subjected to the MDC processing. A concrete method of adjusting the parameter will be described later using FIG. 7. When the parameters are adjusted in such a manner, even if the defect overlooking is caused, then, the misjudgment result can be corrected to the correct judgment result by the MDC. Therefore, it is expected that the process window as the final result will be the same as the result of classifying all of the images thus acquired by the MDC (Step 506).

Figure 6:
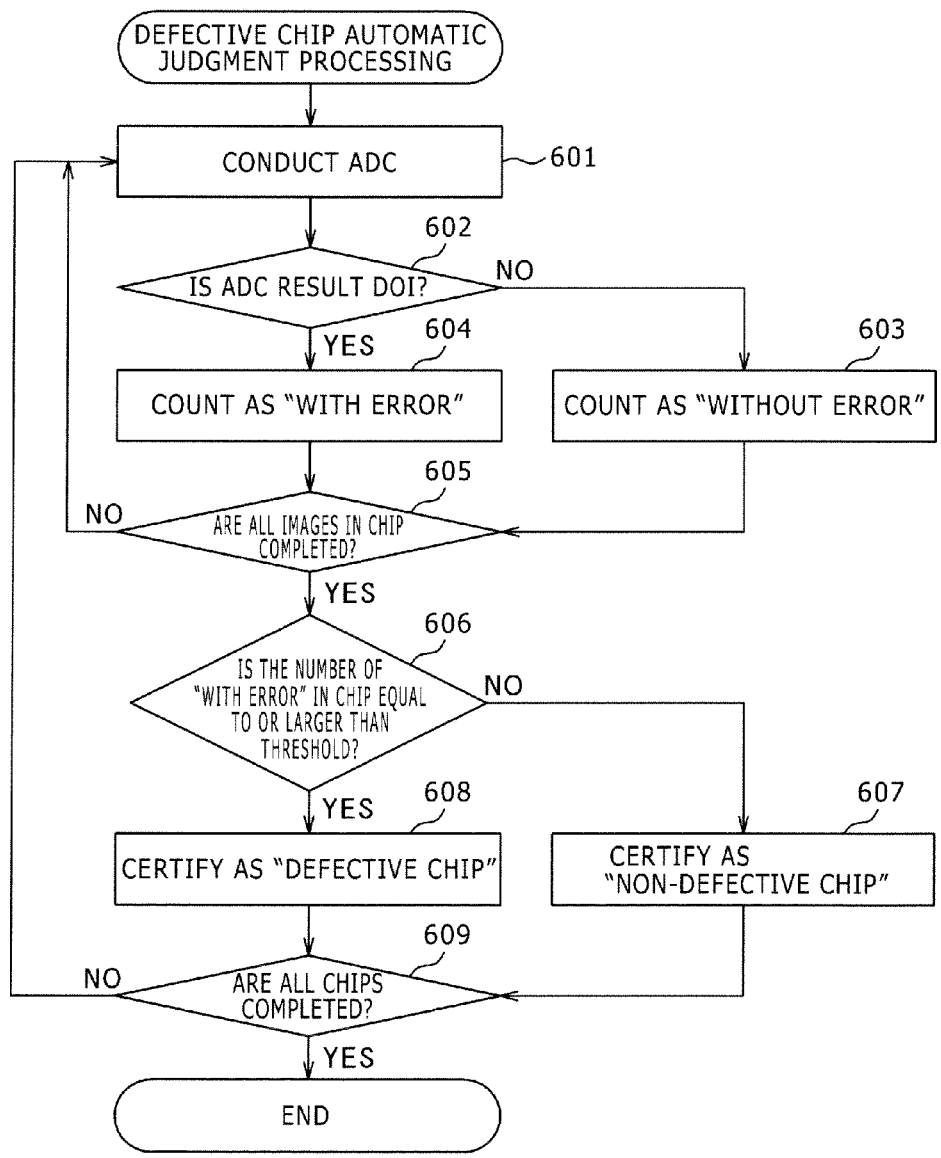
FIG. 6 is a flow chart of processing of defective chip automatic judgment.

FIG. 6 is a flow chart of processing for automatically judging the defective chip, and a concrete example of processing corresponding to Step 503 of FIG. 5. Normally, since a plurality of defect candidates are contained in one chip, the ADC is conducted on the observation image acquired in the coordinate positions of the respective defect candidates (Step 601). When the ADC result is not Defect of Interest (DOI), that is, the defect as the detection object, the image is counted as "without error" (Step 603). In the case of the DOI, the image is counted as "with error" (Step 604). Suppose a produced duct of the manufacturing equipment, for example, is detected as a defect in the inspection instrument, and an image thereof is captured by the observation instrument. However, since the produced duct is not a defect, that is, the DOI to be disregarded in the condition setting using the FEM sample or the monitoring, the image is counted as "without error." The defect to be counted as "with error" is a pattern error caused due to a change in the exposure conditions. The judgment of with or without "error" is made to all of the images in the object chip based on such judgment criteria (Step 605).

Next, when the total number of "with error" in the chip does not exceed the threshold, the chip is certified as a "non-defective chip" (Step 607). When it exceeds the threshold, the chip is certified as a "defective chip." The processing described above is executed on all of the chips (Step 609), whereby the defective chip can be automatically judged by utilizing the ADC.

FIG. 7 is an example of a GUI structure for setting ADC classification parameters suitable for minimizing the MDC work. As shown in FIG. 7, a map in which the non-defective chip is shown by a white color, and the defective chip is shown by hatching is displayed on the display unit. By displaying the map, the distribution of the non-defective/defective chips within the wafer surface can be readily confirmed. In particular, in the FEM wafer described in this embodiment, the exposure conditions are monotonously changed within the wafer surface. Therefore, as shown in FIG. 7, it is estimated that the distribution of the non-detective/defective chips are monotonously changed, and thus can be divided into two parts. In such a case, for intuitively recognizing the distribution, the map display is the most suitable.

A table or a graph representing the non-defective chips and the defective chips, the number of images having the defects and images having no defect, or a ratio between them may be displayed instead of the map display, or in combination of the map display. Moreover, in this embodiment, ADC parameter adjusting means for adjusting the parameters for adjusting the parameters used in the ADC processing is provided in combination with the map display and the table. Although in FIG. 7, the parameter as the setting object is displayed as "defect detection sensitivity," a defect/noise discrimination threshold or other feature value calculation parameter may also be variable instead. When the user carries out the parameter adjustment by the ADC parameter adjusting means, the display and table of the map representing the judgment result by the ADC are operated simultaneously with each other, and the result concerned is updated to the result judged with the parameter after the adjustment by the ADC. It is desirable from a viewpoint of the operability that the ADC judgment result is updated in real time so as to follow the parameter adjustment by the user. However, it may also be available that when a determination button (not shown) for determining the ADC parameter is pressed down, the picture is updated.

Suppose "(b) standard setting" is a standard initial setting, "(a) overlooking prevention setting" reduces the defect detection sensitivity, whereby the number of defective chips based on the ADC result decreases while the number of non-defective chips increases. Like this, when valuing the overlooking prevention of the defective chip, the defect detection sensitivity should be set low to judge a defective chip for certain. After a chip on which the judgment as to whether the chip is defective is difficult is judged as a non-defective chip candidate in the ADC processing, the chip with a possibility of the non-defective chip should be confirmed again by the MDC, whereby it is possible to efficiently realize to prevent the overlooking of the defect. For example, when a purpose is to determine the process window as a group of non-defective chips, the parameter is optimized in such a way that the non-defective chip is widely detected by the ADC, making it efficient to confirm by the MDC with the certainty ensured.

On the other hand, when the extraction of the optimal condition is regarded as important rather than the determination of the process window, the purpose will be to obtain the center of the non-defective chip distribution. In such a case, similarly to "(c) optimal condition judgment setting," the defect is positively detected by increasing the defect detection sensitivity to minimize the number of non-defective chip candidates based on the ADC result, whereby only the non-defective chip candidates are subjected to the MDC work, and then, the time and effort of the MDC work can be minimized.

As above, for any of the operations, the parameter setting will be easy as long as visual confirmation is possible with the parameter change and the non-defective/defective chip distribution change on the wafer map corresponding to the parameter change. In particular, since in the FEM wafer evaluation, the conditions of the lithography are intentionally changed, what kind of process window is obtained can be empirically estimated. Therefore, the ADC parameter, the adjustment of which is generally said as difficult can be adjusted by making reference to the non-defective/defective chip distribution on the predictable wafer map, which leads to the lightening of the workload imposed on the operator. In addition to the ADC parameter and the non-defective/defective chip distribution on the wafer map which corresponds to the parameter setting value, the number of non-defective/defective chip, a rate of occurrence thereof, and moreover, the number of observation image in the respective chips, and a ratio thereof are also effective as the information that makes the ADC parameter adjustment easy.

Figure 8:
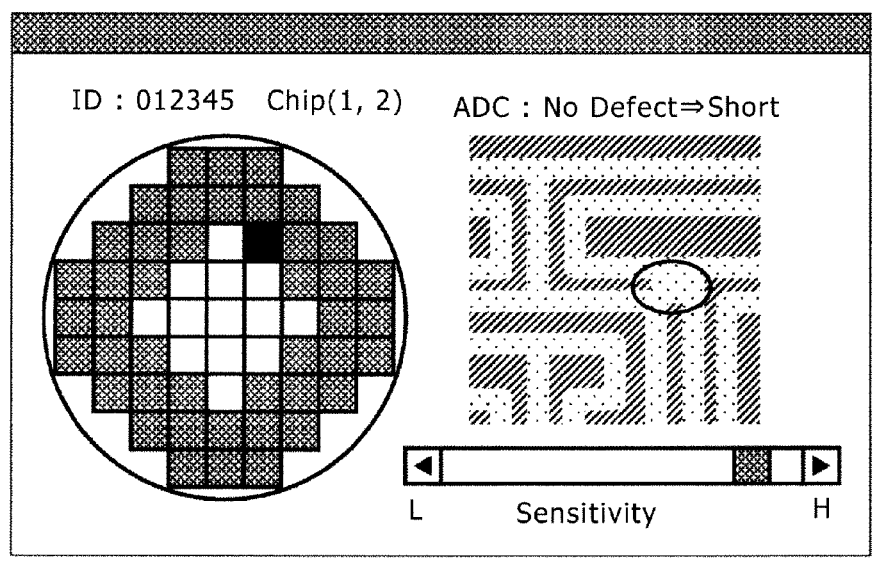
FIG. 8 is an example of a screen of an ADC parameter setting.

FIG. 8 is an example of the GUI representing the defect distribution and the image on the wafer map for the purpose of optimizing the ADC parameter. In such a manner, it is also effective that in addition to the ADC parameter, and the non-defective/defective chip distribution, on the wafer map, which corresponds to the parameter setting value, and moreover, the observation image is displayed, and thus the defect positions on the observation image and the change in the ADC result are displayed so as to correspond to the parameter setting value. It is noted that although in FIG. 8, an example is shown in which one of the images of the defects contained in the chip selected is displayed with a black color, it is better that the chip can be selected from the map display. The chip may be selected by the chip ID as well. In addition, the defect image to be displayed may be switched by selecting the defect ID or the chip coordinates. A plurality of images of the defects may be displayed side by side as well. Moreover, the classification result may be displayed in the form of a list.

According to this embodiment, the ADC parameter setting and the defect distribution on the wafer map are displayed in association with each other. Also, the optimal parameter for the purpose can be simply set by making reference to the change in the defect distribution of the wafer map when the setting values of the parameters are changed.

Next, a description will now be given with respect to a method of lightening the MDC work by using the judgment result of the ADC.

Figure 9:
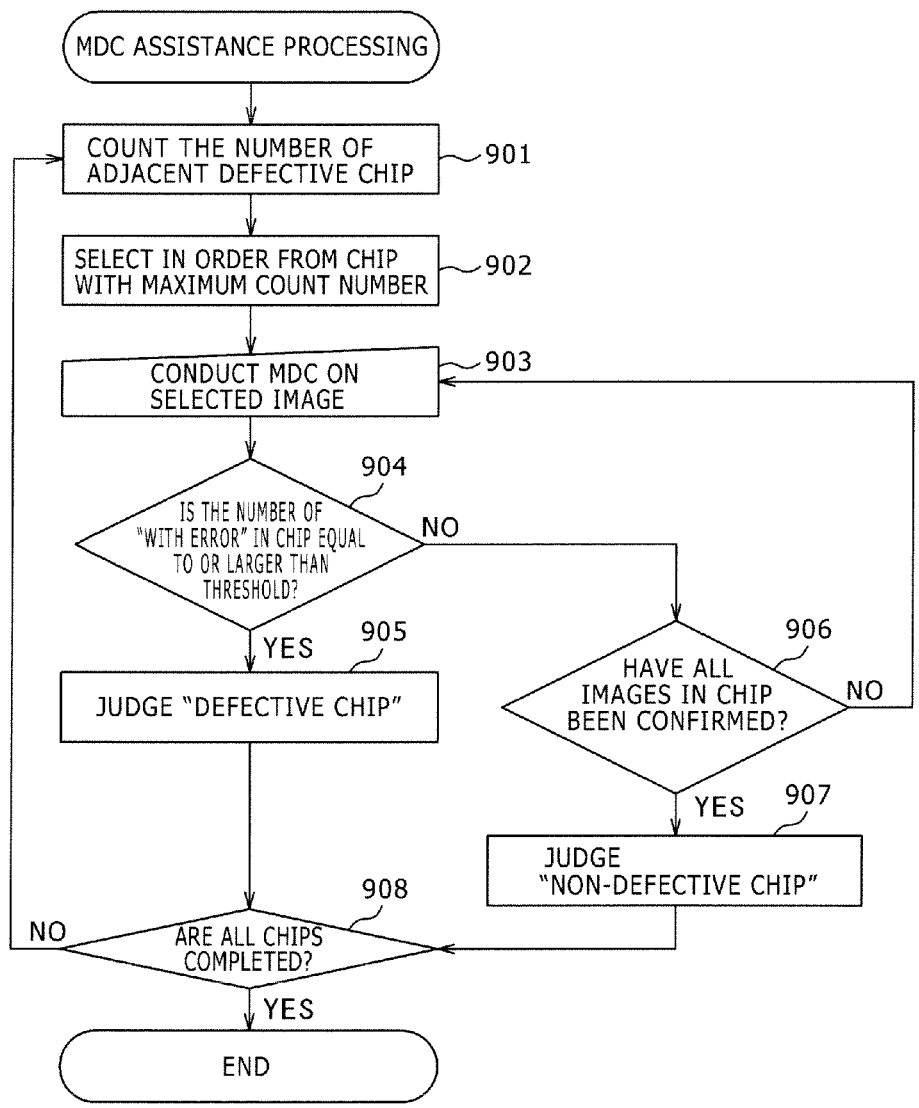
FIG. 9 is a flow chart of processing of MDC assistance.

FIG. 9 is a flow chart of the MDC assistance processing for lightening the burden of the MDC work when the ADC and MDC are used together and corresponds to Step 404 of FIG. 4 and Step 505 of FIG. 5. A description will now be given with respect to an example in which as previously stated the defective chip is determined on the basis of ADC result, and only the non-defective chip candidates are visually confirmed by the MDC. At this time, if the defect extraction sensitivity is set lower, then, the number of non-defective chip candidates increases, and thus, the burden of the MDC work increases too, yet the non-defective chip can be reliably extracted by the visual confirmation.

A description will now be given with respect to a concrete processing flow. Firstly, the number of adjacent defective chip is counted for all of the non-defective chip candidates on the basis of ADC (Step 901). Although the ADC result is adopted for the sake of simplicity of the description, the ADC result may be mixed with the MDC result. In this case, although it is judged that the more the number of adjacent defective chip is, the higher the degree of risk with which the corresponding chip becomes the defective chip is, the degree of risk may be obtained by other method. For example, the possibility that each observation image in the chip is judged as "with error" on the basis of the feature value obtained during the ADC processing may also be quantified to be treated as the degree of risk.

Next, out of the chips having maximum count number, that is, the chips requiring the MDC processing, the ones of with highest degree of risk are selected and displayed in order (Step 902). After this, the MDC is conducted on the chip thus selected (Step 903). In the MDC processing, as previously stated, the defect candidate image in the selected chip is displayed on the display unit, and the user judges whether the image concerned is truly the defect. Then, the judgment result by the user is input through the manipulation unit, and the MDC control unit corrects the ADC judgment result on the basis of the input.

Although the flow of conducting the MDC in order on the chip having maximum count number is described in this case, the MDC may be carried out from the chip having minimum count number depending on a purpose. Determination of the order of the MDC processing will enable all of the non-defective chips to be confirmed without omission. In a viewpoint of eliminating the omission of the observation object necessary for the MDC, for example, as will be described later with reference to FIG. 10, whether the visual confirmation has been yet carried out may be displayed in the form which can be visually judged on the wafer map, thereby preventing the confirmation omission. In addition, the advantage in which the MDC is carried out from the chip having maximum count number in order will be described later with reference to FIG. 10.

When the number of image judged to truly have a defect in a selected chip by the user exceeds a predetermined threshold as the result of the MDC confirmation (Step 904), the chip is judged as a defective chip at that time point (Step 905). Also, the result of the judgment of the chip is determined as defective. As a result, with respect to the remaining images in the chip, the visual confirmation by the MDC can be omitted. In general, a chip that has even one defect in the chip is judged to be defective. Therefore, the visual confirmation work can be omitted as compared with the case where all of the images in the chip are visually confirmed. In particular, since in the boundary chip adjacent to the defective chip, the number of defect candidates is large, and the possibility that a defect occurs is high, the visual confirmation work can be greatly omitted.

On the contrary, when the number of image judged to truly have a defect in a selected chip by the user does not exceed a predetermined threshold (Step 904), the visual confirmation continues with the remaining images in the chip (step 906). When the visual confirmation has completed with all of the observation images, and the number of image judged to truly have a defect by the user does not exceed the predetermined threshold, the chip is determined as a non-defective chip (Step 907). With such a procedure, the non-defective/defective chip is judged with all of the chips (Step 908).

FIG. 10 shows the discrimination of the non-defective/defective chip and the possibility of being a defective chip for non-defective chip candidates in the number of adjacent defective chips. The figure, moreover, is an example of display in a form which is easy to discriminate if an image has been confirmed.

Firstly, "(a) initial display" shows the non-defective chip in white and the defective chip in hatching, which make the non-defective chip and the defective chip readily distinguishable from each other. The non-defective chip candidates displayed in white is the chip for which the good or bad judgment is not yet determined only by the judgment result by the ADC, and which requires the MDC processing. The number of adjacent defective chips is displayed at the non-defective chip candidates of FIG. 10, which makes it possible to visually discriminate the possibility of the image being a defective chip. The number of adjacent chips may be displayed in a color attached to each chip as well.

In "(b) judged emphatic display", the chip judged by the MDC is emphatically displayed. In this example, the defective chip judged by the MDC is displayed in black, and the non-defective chip judged by the MDC is displayed in white without the numerical value display, making the non-defective/defective chip judged by the MDC distinguishable from the non-defective/defective chip judgment result before the judgment, that is, based on the ADC result.

Next, a description will now be given with respect to the advantage as described in Steps 902 and 903 of FIG. 9, the MDC is conducted in descending order of the number of adjacent defective chips, that is, in descending order of the possibility of a chip being a defective chip.

When the number of adjacent defective chip is zero, and all of the adjacent chips have been visually confirmed as in "(c) before non-defective chip automatic judgment" of FIG. 10, the chip can be judged as a non-defective chip without visual confirmation as in "(d) after non-defective chip automatic judgment." When the focus position or dose amount is monotonously changed due to the characteristics of the FEM sample as shown in FIG. 3, since it is rare that a defective chip is isolatedly generated inside a non-defective chip, the chip surrounded by non-defective chips may be automatically judged as a non-defective chip. The defective/non-defective chip are determined in descending order of the number of chip adjacent to the defective chip, that is, from the boundary with the defective chip in order, whereby the non-defective chip can be automatically judged in some cases as in (c) and (d) of FIG. 10. The non-defective chip is also automatically judged, which results in further reduction in workload of visual confirmation, thereby making it possible to lighten the burden of the MDC work.

Figure 11:
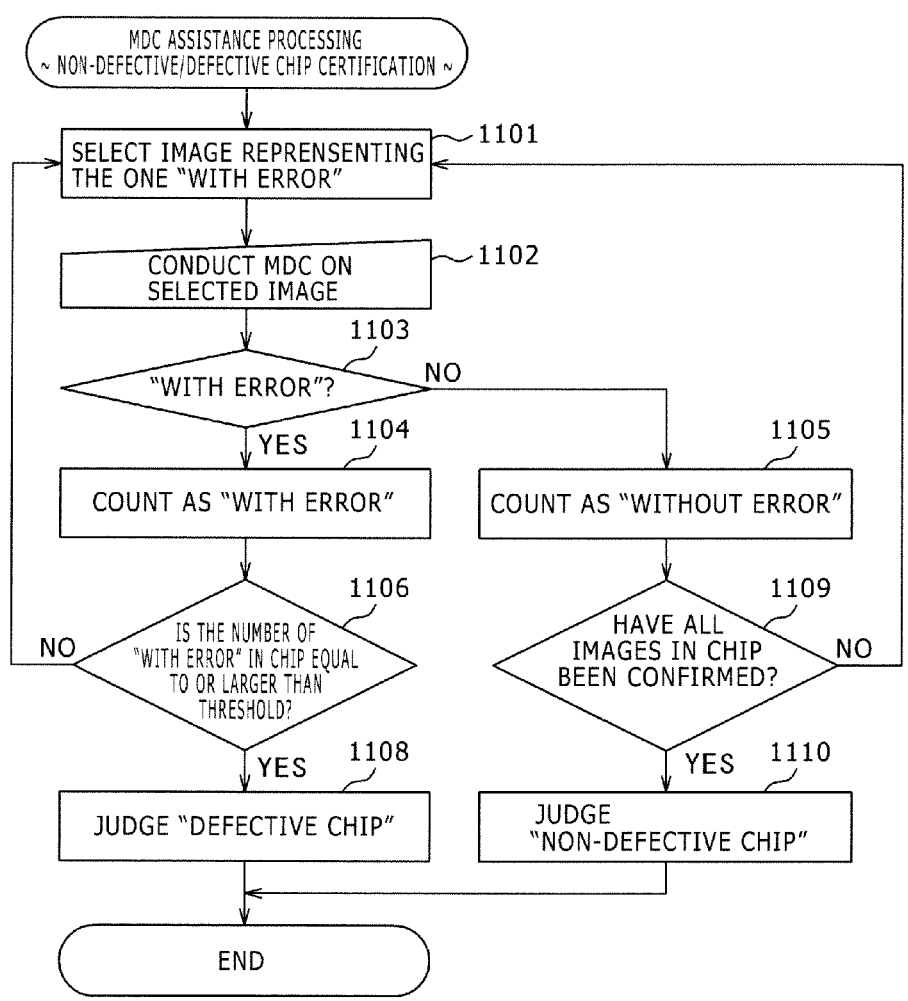
FIG. 11 is a flow chart of processing of passed/defective chip judgment.

A description will now be given with respect to an example in which a plurality of images in the chip is rearranged in order of priority. FIG. 11 is a flow chart showing a method in which during the MDC work the images are visually confirmed in order of the images most likely to be "with error," thereby minimizing the burden of the visual confirmation work. Since a plurality of images is normally present in the selected chip, it is only necessary that the MDC processing be conducted on the images in order of priority, thereby determining the classification evaluation of the defect. In this embodiment, the priority is judged on the basis of degree of risk of the defect candidate in the images, that is, the probability that the defect candidate is the DOI. Hereinafter, the degree of risk of the defect candidate is expressed as being likely to be "with error." FIG. 11 shows a concrete procedure, for lightening the burden of the MDC work, which corresponds to Step 903 of FIG. 9. Firstly, an image that is the most likely to be "with error" out of the selected chips is selected.

The size of the defect candidate is an easy example to understand of the criterion for determination of the image likely to be "with error." In general the ADC obtains various feature values so as to specify the kind of defect on the basis of the feature value distribution in the feature value space which is the space with these feature values in the axis. The feature value, for example, includes size, shape, luminous distribution, and texture of the defect unit, or size, shape, luminous distribution, texture of the background pattern, and the positional relationship between the defect unit and the background pattern. When the defect size among these features is used, suppose that a differences between a defect image and normal image are extracted, and the sum of the difference areas is set as a feature value corresponding to the defect size, and for simplicity, "with error" is judged only on the basis of the feature value. In this case, even the difference such as edge roughness of a pattern, which should not be thought to be with error but to be manufacturer's tolerance, may be extracted. However, it is possible to think that the larger the sum of the difference areas is, the more likely the image is to be "with error," that is, the more likely the image is be defective. Therefore, the image is selected in descending order of largest sum of difference areas (Step 1101), and the MDC is conducted on the selected image (Step 1102). The image likely to be "with error" is judged simply on the basis of a feature value, that is, the feature value corresponding to the defect size in this embodiment. However, a method may also be used in which a plurality of feature values are obtained, and the image likely to be "with error" is judged on the basis of feature value distribution in the feature value space.

Next, the number of images "with error" and "without error" is counted by user's visual confirmation (Step 1104 and Step 1105). When "with error" is counted, it is judged whether the number of "with error" in the chip exceeds the threshold (Step 1106). When it exceeds the threshold, the remaining images in the chip are not visually confirmed, and the chip is judged as defective at that time to determine the judgment result (Step 1108). Then, the MDC processing for the chip concerned ends.

When an image is counted as "without error" in Step 1103 (Step 1105), it is judged whether all of the images in the chip has been visually confirmed by the user (Step 1109). When all of the images have been confirmed, the chip concerned is judged as non-defective because the number of "with error" in the chip does not exceed the threshold (Step 1110). In such a manner, the images are confirmed in order of an image most likely to be "with error," the chip is judged as defective at the point when the number of "with error" exceeds the threshold. By omission of the confirmation work with the remaining mages, the visual confirmation work can be further lightened. Since the ADC processing is conducted as the preprocessing of the MDC processing in this embodiment, the ADC can automatically judge the degree of risk of the defect candidate, thereby determining the order of the MDC processing.

Figure 12:
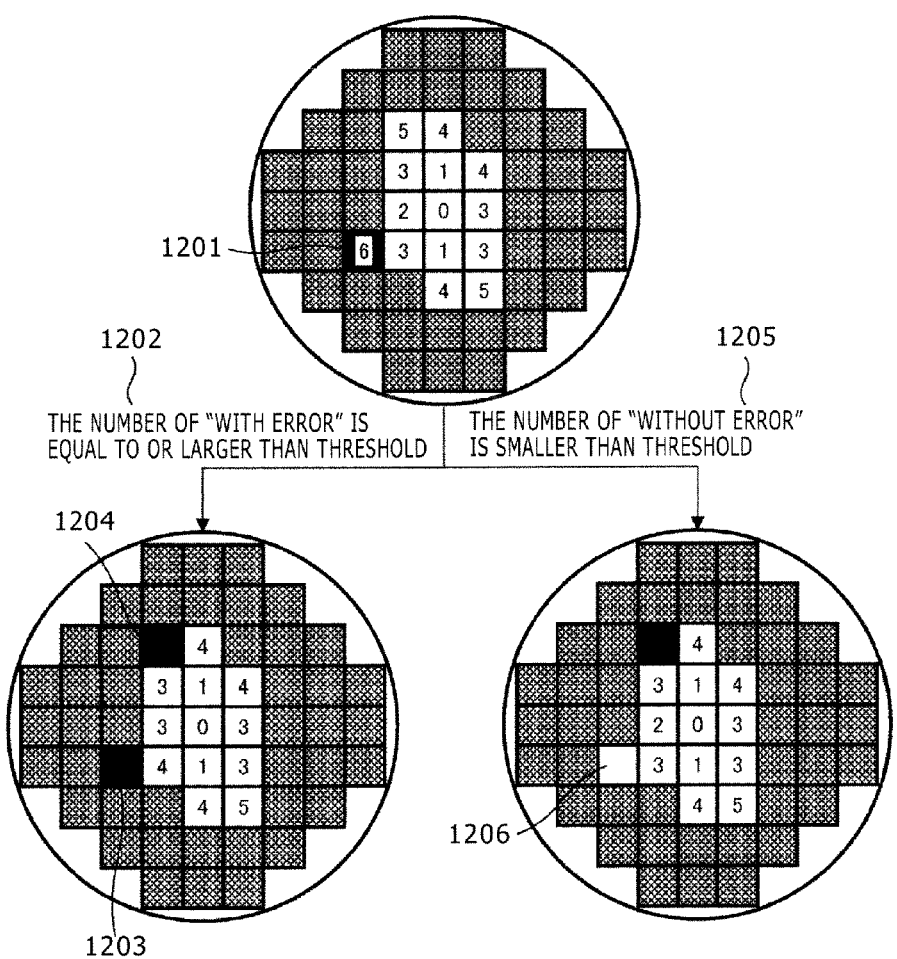
FIG. 12 is an example of wafer map transition in the processing of the MDC assistance.

FIG. 12 is an example of the map display corresponding to the flow of FIG. 9. That is to say, FIG. 12 shows an example of the wafer map transition in the case where the defective chip is determined on the basis of ADC result; the number of defective chips adjacent to respective non-defective candidates judged to be non-defective by ADC is counted and then displayed; and the chips are visually confirmed in order of the probability of the chips estimated to be likely to be defective.

First, the chip 1201 that has the maximum number of adjacent defective chips is selected as the first chip subject to MDC. The user confirms the image for the defect candidate in the chip concerned and judges whether the image is "with error." At a point when the number of "with error" exceeds the threshold (Step 1202), the judgment in which the chip is the defective chip is determined, and then, the judgment processing of the non-defective/defective chip ends. The concrete procedure and the method of minimizing the burden of the visual confirmation work are as has been described with reference to FIG. 9 and FIG. 11.

The chip 1203 that has been determined as a defective chip by the MDC processing, as has been described with reference to FIG. 10, is displayed in such a manner as to be visually distinguished from the chip that is MDC-unprocessed in such a way that it is understandable that the chip 1203 has been confirmed. Also, the number of adjacent defective chips is anew counted because the defective chip is newly determined, and as a result, the number of counts of the chips adjacent to the determined defective chip changes. As the result of recounting the number of adjacent defective chips, the MDC processing is similarly conducted on the chip 1204 with the maximum number of counts out of the MDC-unprocessed chips that are non-defective candidates. In such a manner, at a point when the chip is determined as defective, the MDC work of the chip ends, thereby making it possible to lighten the work burden. In addition, when the defective chip is newly determined, the information on the degree of risk other than the defective chip concerned is updated, which results in that the MDC work can be efficiently carried out on the basis of the latest information on the degree of risk.

Next, a description will now be given with respect to the case where the number of "with error" does not exceed the threshold. When the number of "with error" does not exceed the threshold (1205), the chip is determined as the non-defective chip 1206, and is displayed in such a way that it is understandable that the chip has been confirmed. Then, the work proceeds to the next chip confirmation work. In this case, since there is no change in the number of defective chips previously counted, it is not unnecessary to newly recount the number of adjacent defective chips for the MDC-unprocessed chips.

Figure 13:
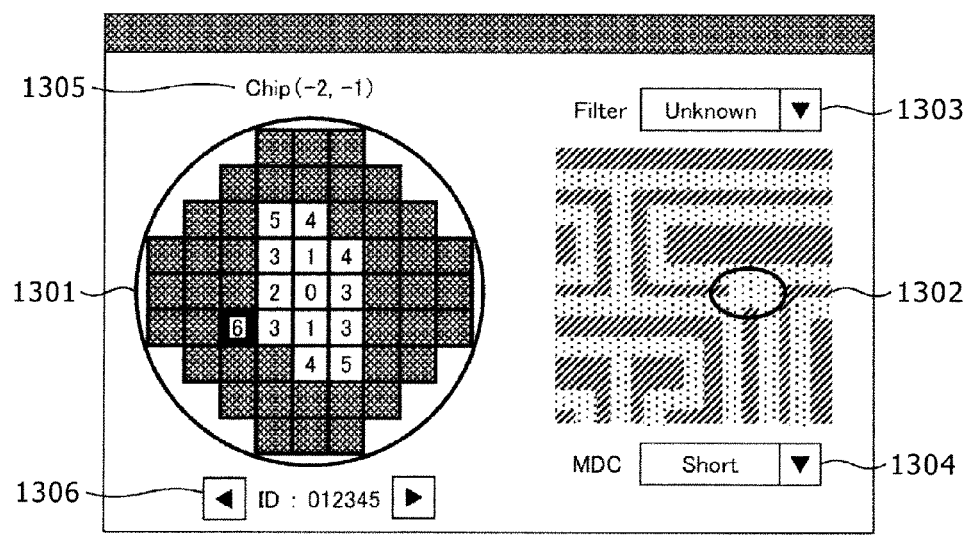
FIG. 13 is a screen structural view in the processing of the MDC assistance.

FIG. 13 is a GUI example in which the user efficiently executes the MDC processing as described above. While the MDC work is carried out, the wafer map 1301, and the observation image 1302 of the defect candidate are preferably displayed in association with each other. As previously stated, the wafer map is displayed in such a manner as to distinguish the non-defective/defective chips from each other. Moreover, the addition of the information on the degree of risk, the confirmed chip, and the focused-on-chip will be effective in the improvement in the efficiency of the MDC work. It is better that the defect area detected by the ADC be overlay-displayed for the observation image. If filtering means 1303 for selectively displaying the defect candidate image depending on the kind of defect judged by the ADC is added, then, the observation image only desired to be confirmed can be displayed based on the ADC result. Although in this case, the ADC result is adopted, the ADC result may be mixed with the MDC result. The method of inputting the MDC result may be a system in which the classification code is selected by an MDC result selection column 1304 as shown in the figure, or a system in which the classification code is directly input from the input device such as the keyboard. In addition thereto, a configuration in which a chip number 1305 on which attention is focused and an ID 1306 of the observation image on which attention is focused are displayed together, and the user specifies each of these, thereby making it possible to select a chip as the MDC object or a defect candidate image to be displayed will be advantageous.

DESCRIPTION OF REFERENCE NUMERALS

101 electron gun
102 lens
103 deflector
104 objective lens
105 specimen
106 stage
107 primary electron beam
108 secondary particle
109 secondary particle detector
110 electronic optical system control unit
111 A/D conversion unit
112 stage control unit
113 overall control unit
114 image processing unit
115 manipulation unit
116 storage device
117 ADR processing unit
118 classification processing unit
119 optical microscope
120, 206 display unit
201 image information storage unit
202 classification control unit
203 image processing unit
204 classification processing unit
205 classification information storage unit
207 keyboard
208 mouse
301 focus position conditions
302 dose amount conditions
1201, 1204 chip with the maximum degree of risk
1203 defective determination chip
1206 non-defective determination chip
1301 wafer map
1302 defect candidate image
1303 filter setting column
1304 MDC result selection column
1305 chip number display unit
1306 ID selection unit

The invention claimed is:

1. A charged particle beam apparatus for radiating a charged particle beam to a previously specified coordinate position contained in a plurality of observation objects on a wafer, thereby acquiring an image corresponding to the coordinate position and judging the good or bad of the observation objects on the basis of information obtained from the image, the charged particle beam apparatus comprising:
   an automatic defect classification (ADC) processing unit for classifying the image on the basis of the information obtained from the image, thereby judging the good or bad of the observation objects;
   a manual defect classification (MDC) processing unit for conducting MDC processing for correcting a classification result of the image by the ADC processing unit in accordance with an instruction from a user;
   a display unit for displaying a judgment result by the ADC processing unit; and
   a parameter setting device for adjusting a parameter used in the judgment in the ADC processing unit, wherein:
   the MDC processing unit extracts the observation objects to be MDC-processed on the basis of the judgment result by the ADC processing unit,
   the display unit displays the image corresponding to the coordinate position contained in the observation object extracted by the MDC processing unit as an object to be MDC-processed, and a map in such a way that the good or bad of at least the observation objects are distinguished from each other, and
   the judgment result of the ADC processing unit is updated in accordance with a value of the parameter, when the parameter is changed by the parameter setting device.

2. The charged particle beam apparatus according to claim 1, wherein
   the judgment result by the ADC processing unit is expressed by one or more of a map of the good or bad, the number of a non-defective product, the number of a defective product, an occurrence rate of the non-defective product, an occurrence rate of the defective product, an observation image, defect area information on the observation image, a reference image, and ADC result.

3. The charged particle beam apparatus according to claim 1, wherein the wafer is a wafer manufactured by changing exposure conditions for chips within the wafer.

4. The charged particle beam apparatus according to claim 1, wherein charged particle beam apparatus has means for determining an order of the observation objects on which the MDC processing is conducted on the basis of the good or bad judgment result of the observation objects by the ADC processing unit.

5. The charged particle beam apparatus according to claim 4, wherein the order is determined on the basis of information obtained from the good or bad judgment result of the adjacent observation objects or the corresponding to the coordinate position contained in the observation objects.

6. The charged particle beam apparatus according to claim 1, wherein the charged particle beam apparatus has means for determining an order of the image on which the MDC processing is to be conducted on the basis of a degree of risk of error occurrence in the coordinate position by the ADC processing unit.

7. The charged particle beam apparatus according to claim 1 further comprising:
   means for grouping an area on the specimen by the observation objects on the basis of position information on the specimen.

8. The charged particle beam apparatus according to claim 1, wherein
   the MDC processing unit determines the good or bad judgment to the observation objects at a point when the number of defects contained in the observation objects exceeds a predetermined threshold.

9. A non-transitory computer-readable recording medium in which a program executed in an image processing apparatus for judging the good or bad of a plurality of observation objects on a wafer based on information obtained from images, of previously specified coordinate position contained in the observation objects, that are obtained by radiating a charged particle beam to the previously specified coordinate position is recorded, wherein:
   the program, when executed, causes the image processing apparatus to execute:
      performing automatic defect classification (ADC) processing for classifying the image on the basis of the information obtained from the image, thereby judging the good or bad of the observation objects;
      displaying a judgment result by the ADC processing;
      adjusting a parameter used in the judgment in the ADC processing;
      performing manual defect classification (MDC) processing for correcting a classification result of the image in the coordinate position contained in the observation objects extracted on the basis of the result in accordance with an instruction from a user is conducted;
      displaying a map in such a way that the good or bad of at least the observation objects are distinguished from each other; and
      updating the judgment result of the ADC processing in accordance with a value of the parameter, when the parameter is changed.

* * * * *